(12) United States Patent
Seo et al.

(10) Patent No.: US 10,460,771 B2
(45) Date of Patent: Oct. 29, 2019

(54) SEMICONDUCTOR CHIP MODULE AND SEMICONDUCTOR PACKAGE INCLUDING THE SAME

(71) Applicant: SK hynix Inc., Icheon-si, Gyeonggi-do (KR)

(72) Inventors: Hyun Chul Seo, Yongin-si (KR); Jun Sik Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/265,517

(22) Filed: Feb. 1, 2019

(65) Prior Publication Data

US 2019/0164578 A1    May 30, 2019

Related U.S. Application Data

(62) Division of application No. 15/051,174, filed on Feb. 23, 2016, now Pat. No. 10,366,727.

(30) Foreign Application Priority Data

Oct. 19, 2015  (KR) .................. 10-2015-0145253

(51) Int. Cl.
*G11C 5/06* (2006.01)
*H01L 23/544* (2006.01)
(Continued)

(52) U.S. Cl.
CPC .......... *G11C 5/063* (2013.01); *H01L 23/5286* (2013.01); *H01L 23/544* (2013.01);
(Continued)

(58) Field of Classification Search
CPC ... G11C 5/063; H01L 23/5286; H01L 23/544; H01L 23/60; H01L 24/06; H01L 25/0655;
(Continued)

(56) References Cited

U.S. PATENT DOCUMENTS 6,448,865 B1   9/2002 Miller
6,963,134 B2  11/2005 Otani
(Continued)

FOREIGN PATENT DOCUMENTS

CN        104821315 B    6/2018
KR   1020120126364 A   11/2012

*Primary Examiner* — Fernando L Toledo
*Assistant Examiner* — Neil R Prasad
(74) *Attorney, Agent, or Firm* — William Park & Associates Ltd.

(57) ABSTRACT

A semiconductor chip module includes a chip unit including first and second semiconductor chips formed over a single body to be adjacent in a first direction with a scribe line region interposed therebetween, and having a first surface over which bonding pads of the first and second semiconductor chips are positioned; redistribution lines formed over the first surface, having one set of ends which are respectively electrically coupled to the bonding pads, and extending in a direction oblique to the first direction toward the scribe line region; and redistribution pads disposed over the first surface, and electrically coupled with another set of ends of the redistribution lines. The redistribution pads includes shared redistribution pads electrically coupled in common to the redistribution lines electrically coupled to the bonding pads of the first semiconductor chip and the redistribution lines electrically coupled to the bonding pads of the second semiconductor chip; and individual redistribution pads individually electrically coupled to the redistribution lines which are not electrically coupled with the shared redistribution pads.

21 Claims, 10 Drawing Sheets

(51) Int. Cl.
    *H01L 23/528*     (2006.01)
    *H01L 23/00*     (2006.01)
    *H01L 25/065*     (2006.01)
    *H01L 23/60*     (2006.01)
    *H01L 23/13*     (2006.01)

(52) U.S. Cl.
    CPC .............. *H01L 23/60* (2013.01); *H01L 24/06* (2013.01); *H01L 25/0655* (2013.01); *H01L 23/13* (2013.01); *H01L 24/05* (2013.01); *H01L 24/32* (2013.01); *H01L 24/48* (2013.01); *H01L 24/73* (2013.01); *H01L 2224/02166* (2013.01); *H01L 2224/02373* (2013.01); *H01L 2224/04042* (2013.01); *H01L 2224/05553* (2013.01); *H01L 2224/06136* (2013.01); *H01L 2224/32225* (2013.01); *H01L 2224/4824* (2013.01); *H01L 2224/48091* (2013.01); *H01L 2224/73215* (2013.01); *H01L 2924/00014* (2013.01); *H01L 2924/1436* (2013.01); *H01L 2924/1438* (2013.01); *H01L 2924/15151* (2013.01); *H01L 2924/15311* (2013.01); *H01L 2924/181* (2013.01)

(58) Field of Classification Search
    CPC ......... H01L 23/13; H01L 24/05; H01L 24/32; H01L 24/48; H01L 24/73; H01L 2224/02166; H01L 2224/02373; H01L 2224/04042; H01L 2224/05553; H01L 2224/06136; H01L 2224/32225; H01L 2224/48091; H01L 2224/4824; H01L 2224/73215; H01L 2924/00014; H01L 2924/1436; H01L 2924/1438; H01L 2924/15151; H01L 2924/15311; H01L 2924/181

See application file for complete search history.

(56) References Cited

U.S. PATENT DOCUMENTS

| | | |
|---|---|---|
| 7,667,330 B2 | 2/2010 | Lee |
| 7,847,419 B2 | 12/2010 | Yang et al. |
| 8,432,039 B2 | 4/2013 | Maki et al. |
| 9,472,545 B2 | 10/2016 | Chen et al. |
| 2003/0227079 A1* | 12/2003 | Chia .................. H01L 23/3114 257/723 |
| 2014/0347943 A1* | 11/2014 | Kim .................... G11C 29/886 365/200 |

\* cited by examiner

SEMICONDUCTOR CHIP MODULE AND SEMICONDUCTOR PACKAGE INCLUDING THE SAME

CROSS-REFERENCE TO RELATED APPLICATION

The present application is a divisional application for U.S. patent application Ser. No. 15/051,174 filed on Feb. 23, 2016 and claims priority under 35 U.S.C. § 119(a) to Korean Patent Application No. 10-2015-0145253 filed in the Korean Intellectual Property Office on Oct. 19, 2015, which is incorporated herein by reference in its entirety.

BACKGROUND

1. Technical Field

Various embodiments generally relate to a semiconductor technology, and more particularly, to a semiconductor chip module and a semiconductor package including the same.

2. Related Art

Failure modes occurring in a semiconductor device exist in various types. Failure modes by electrical phenomena include electrical overstress (EOS) and electrostatic discharge (ESD).

An ESD phenomenon refers to a phenomenon that occurs as static electricity flows. Electrostatic current by the ESD phenomenon is likely to be applied to a diode or a transistor in a semiconductor device and destroy functionality of these elements. That is to say, high current by static electricity is applied between PN junctions of a diode and causes a junction spike, or breaks down the gate dielectric layer of a transistor and short-circuits a gate, a drain and a source, thereby markedly deteriorating reliabilities of the elements.

ESD phenomena are classified into a human body model (HBM), a machine model (MM) and a charged device model (CDM) according to causes of static electricity generation. The HBM represents a phenomenon that static electricity generated in a charged human body is momentarily discharged through an element in a semiconductor device and breaks down the element. The MM represents a phenomenon that static electricity generated in a charged machine is momentarily discharged through an element in a semiconductor device and breaks down the element. The CDM represents a phenomenon that static electricity accumulated in a semiconductor device in the course of manufacturing the semiconductor device is momentarily discharged through grounding with an external conductor and breaks down an element in the semiconductor device.

In the CDM, because the semiconductor device is broken down by itself by the charges charged in the semiconductor device, the CDM exerts a significant influence on the reliability of a product. Therefore, semiconductor device manufacturers are continually making efforts to measure a CDM property through charge discharge modeling and thereby secure a CDM property of a level demanded by customers.

SUMMARY

In an embodiment, a semiconductor chip module may include a chip unit including first and second semiconductor chips which are formed over a single body to be adjacent in a first direction with a scribe line region interposed therebetween, and having a first surface over which bonding pads of the first and second semiconductor chips are positioned and a second surface which faces away from the first surface. The semiconductor chip module also includes a plurality of redistribution lines formed over the first surface, having one set of ends which are respectively electrically coupled to the bonding pads of the first and second semiconductor chips, and extending in a direction oblique to the first direction toward the scribe line region. The semiconductor chip module also includes a plurality of redistribution pads disposed over the first surface, and electrically coupled with another set of ends of the redistribution lines which face away from the one set of ends. The redistribution pads include: one or more shared redistribution pads electrically coupled in common to the one or more of redistribution lines electrically coupled to the bonding pads of the first semiconductor chip and the one or more of redistribution lines electrically coupled to the bonding pads of the second semiconductor chip; and a plurality of individual redistribution pads individually electrically coupled to the redistribution lines which are not electrically coupled with the shared redistribution pads.

In an embodiment, a semiconductor package may include a substrate including a top surface, a bottom surface, an opening which passes through the top surface and the bottom surface, and coupling pads formed over the bottom surface. The semiconductor package may also include a semiconductor chip module including a chip unit including first and second semiconductor chips formed over a single body to be adjacent in a first direction with a scribe line region interposed therebetween, and having a first surface over which bonding pads of the first and second semiconductor chips are positioned and a second surface which faces away from the first surface, a plurality of redistribution lines formed over the first surface, having one set of ends which are respectively electrically coupled to the bonding pads of the first and second semiconductor chips, and extending in a direction oblique to the first direction toward the scribe line region, and a plurality of redistribution pads disposed over the first surface, and electrically coupled with another set of ends of the redistribution lines which face away from the one set of ends, the semiconductor chip module being disposed over the substrate such that the redistribution pads are exposed through the opening. The semiconductor package may also include conductive coupling members electrically coupling the redistribution pads and the coupling pads through the opening. The redistribution pads may include one or more shared redistribution pads electrically coupled in common to the one or more of redistribution lines electrically coupled to the bonding pads of the first semiconductor chip and the one or more redistribution lines electrically coupled to the bonding pads of the second semiconductor chip. The redistribution pads may also include a plurality of individual redistribution pads individually electrically coupled to the redistribution lines which are not electrically coupled with the shared redistribution pads.

DETAILED DESCRIPTION

Hereinafter, a semiconductor chip module and a semiconductor package including the same will be described below with reference to the accompanying figures through various examples of embodiments.

Figure 1:
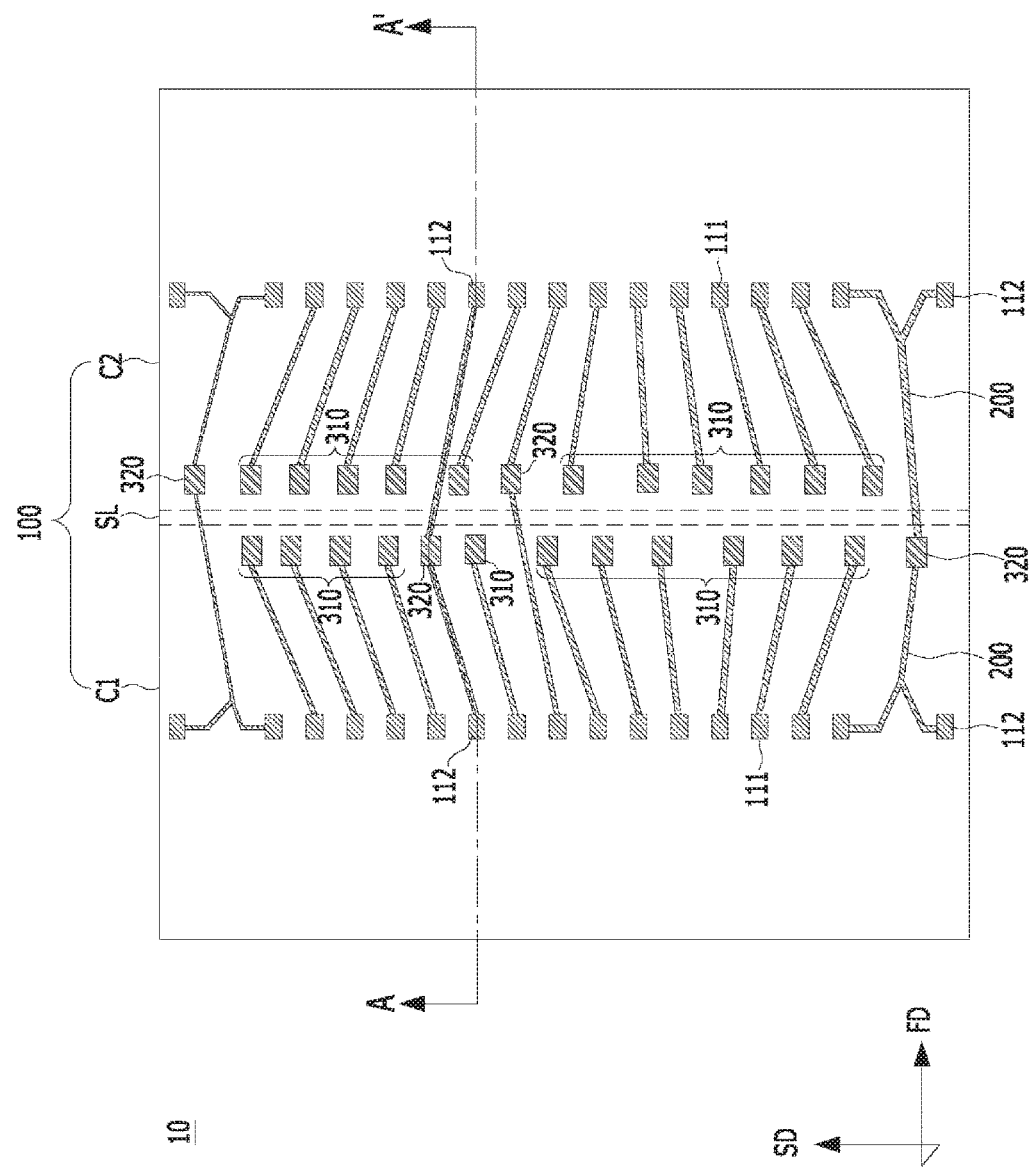
FIG. 1 is a top view illustrating a representation of an example of a semiconductor chip module in accordance with an embodiment.
Figure 2:
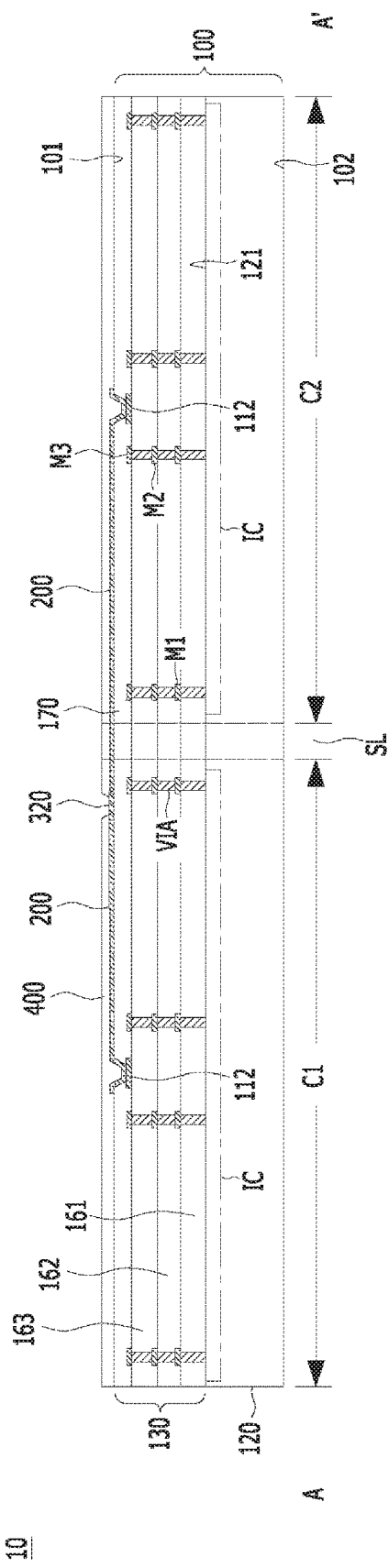
FIG. 2 is a cross-sectional view taken along the line A-A' of FIG. 1.

Referring to FIGS. 1 and 2, a semiconductor chip module 10 in accordance with an embodiment may include a chip unit 100, and a plurality of redistribution lines 200 and a plurality of redistribution pads 310 and 320 which are formed on the chip unit 100.

The chip unit 100 may be defined by forming a plurality of semiconductor chips on a semiconductor wafer by a semiconductor manufacturing technology such that the plurality of semiconductor chips are disposed adjacently on both sides of a scribe line region SL in a first direction FD and a second direction SD. The chip unit 100 may also be defined by sawing the semiconductor wafer such that the plurality of semiconductor chips are individualized by the unit of two semiconductor chips which are disposed adjacently on both sides of the scribe line region SL in the first direction FD.

In the following descriptions, for the sake of convenience in explanation, two semiconductor chips C1 and C2 included in the chip unit 100 will be defined as a first semiconductor chip C1 and a second semiconductor chip C2. The first direction FD may be a column direction, that is, a bit line direction. Further, the second direction SD may be a row direction, that is, a word line direction.

The chip unit 100 may include the scribe line region SL. In addition, the first semiconductor chip C1 and the second semiconductor chip C2 which are formed adjacently to each other in the first direction FD with the scribe line region SL interposed therebetween. Thus, the chip unit 100 may be a single body including the first semiconductor chip C1, the second semiconductor chip C2, and the scribe line region SL. The first and second semiconductor chips C1 and C2 included in the chip unit 100 may have substantially the same structure.

The chip unit 100 may have a first surface 101 and a second surface 102 which faces away from the first surface 101. Each of the first and second semiconductor chips C1 and C2 included in the chip unit 100 may have a plurality of bonding pads 111 and 112 which are exposed on the first surface 101. The bonding pads 111 and 112 may be arranged along the center portion of the first surface 101 of each of the first and second semiconductor chips C1 and C2 in the second direction SD perpendicular to the first direction FD. In other words, each of the first and second semiconductor chips C1 and C2 may be a center pad type chip. Each of the first and second semiconductor chips C1 and C2 may be an edge pad type chip in which bonding pads are arranged adjacent to and along an edge of the first surface 101 of each of the first and second semiconductor chips C1 and C2. In addition, while it is illustrated in an embodiment that the bonding pads 111 and 112 are formed in one line in each of the first and second semiconductor chips C1 and C2, it is to be noted that the bonding pads 111 and 112 may be formed in at least two lines in each of the first and second semiconductor chips C1 and C2.

The chip unit 100 may further include a base substrate 120 in which integrated circuits IC of the first and second semiconductor chips C1 and C2 are formed. In addition, an interconnect structure 130 is formed on the base substrate 120.

The base substrate 120 may include a semiconductor substrate such as a bulk silicon substrate. Further, the base substrate 120 may include other semiconductor materials such as III group, IV group and/or V group elements. The base substrate 120 may have an active surface 121 and a back surface which faces away from the active surface 121. Further, the back surface of the base substrate 120 may be substantially the same surface as the second surface 102 of the chip unit 100. The integrated circuits IC of the first and second semiconductor chips C1 and C2 may be formed to a partial depth of the base substrate 120 from the active surface 121.

The integrated circuits IC will be described below with reference to FIG. 3.

Figure 3:
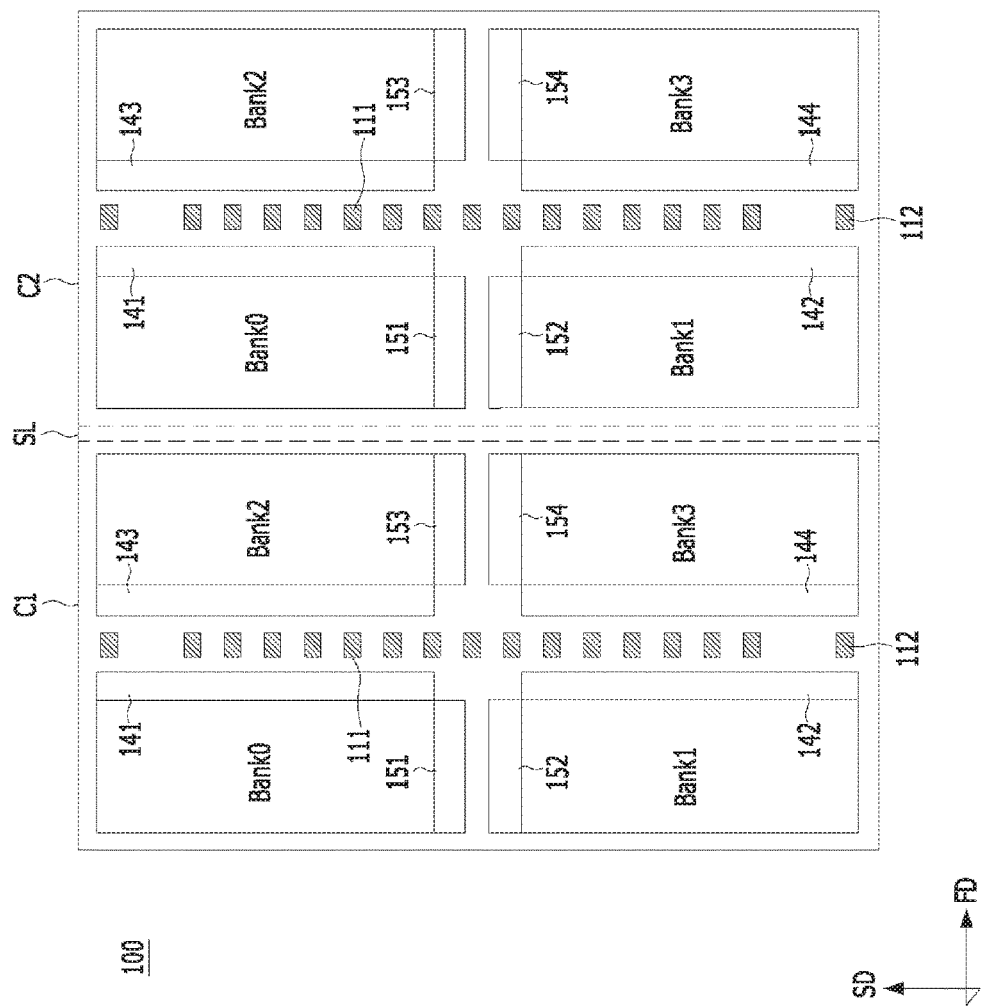
FIG. 3 is a top view illustrating integrated circuits of FIG. 2.

Referring to FIG. 3, each of the integrated circuits IC of the first and second semiconductor chips C1 and C2 may include memory cell arrays Bank0 to Bank3, a plurality of column decoders 141 to 144, and a controller.

The memory cell arrays Bank0 to Bank3 may include a first memory bank Bank0 and Bank1 and a second memory bank Bank2 and Bank3 which are disposed separately from each other in the first direction FD with the bonding pads 111 and 112 interposed therebetween and are selectively activated by a bank address signal.

Each of the first memory bank Bank0 and Bank1 and the second memory bank Bank2 and Bank3 may be disposed by being physically divided into a plurality of sub banks. In an embodiment, the first memory bank Bank0 and Bank1 may include a first sub bank Bank0 and a second sub bank Bank1 which are disposed in the second direction SD. Further, the second memory bank Bank2 and Bank3 may include a third sub bank Bank2 and a fourth sub bank Bank3 which are disposed in the second direction SD.

A first row decoder 151 corresponding to the first sub bank Bank0 and a second row decoder 152 corresponding to the second sub bank Bank1 may be disposed between the first sub bank Bank0 and the second sub bank Bank1. Moreover, a third row decoder 153 corresponding to the third sub bank Bank2 and a fourth row decoder 154 corresponding to the fourth sub bank Bank3 may be disposed between the third sub bank Bank2 and the fourth sub bank Bank3.

Each of the first to fourth row decoders 151 to 154 generates a decoded row address by decoding a row address provided from the controller. The first to fourth row decoders 151 to 154 also generate a word line driving signal for controlling selection of a word line of a sub bank corresponding to it, based on the decoded row address.

The column decoders 141 to 144 may include first to fourth column decoders respectively corresponding to the first to fourth sub banks Bank0 to Bank3. Each of the first to fourth column decoders 141 to 144 may be disposed side by side with a sub bank corresponding to it when viewed in the second direction SD, adjacent to the bonding pads 111 and 112. Each of the first to fourth column decoders 141 to 144 may generate a decoded column address by decoding a column address provided from the controller. The first to fourth column decoders 141 to 144 may also generate a column select signal for controlling selection of a bit line of a sub bank corresponding to it, based on the decoded column address.

The controller may generate a row address and a column address in response to an address signal which is inputted from an exterior. The first to fourth sub banks Bank0 to Bank3 may include pluralities of memory cells, and may operate in response to column select signals provided from the first to fourth column decoders 141 to 144 and word line driving signals provided from the first to fourth row decoders 151 to 154. Constructions of the sub banks Bank0 to Bank3 will be described below with reference to FIG. 4.

Figure 4:
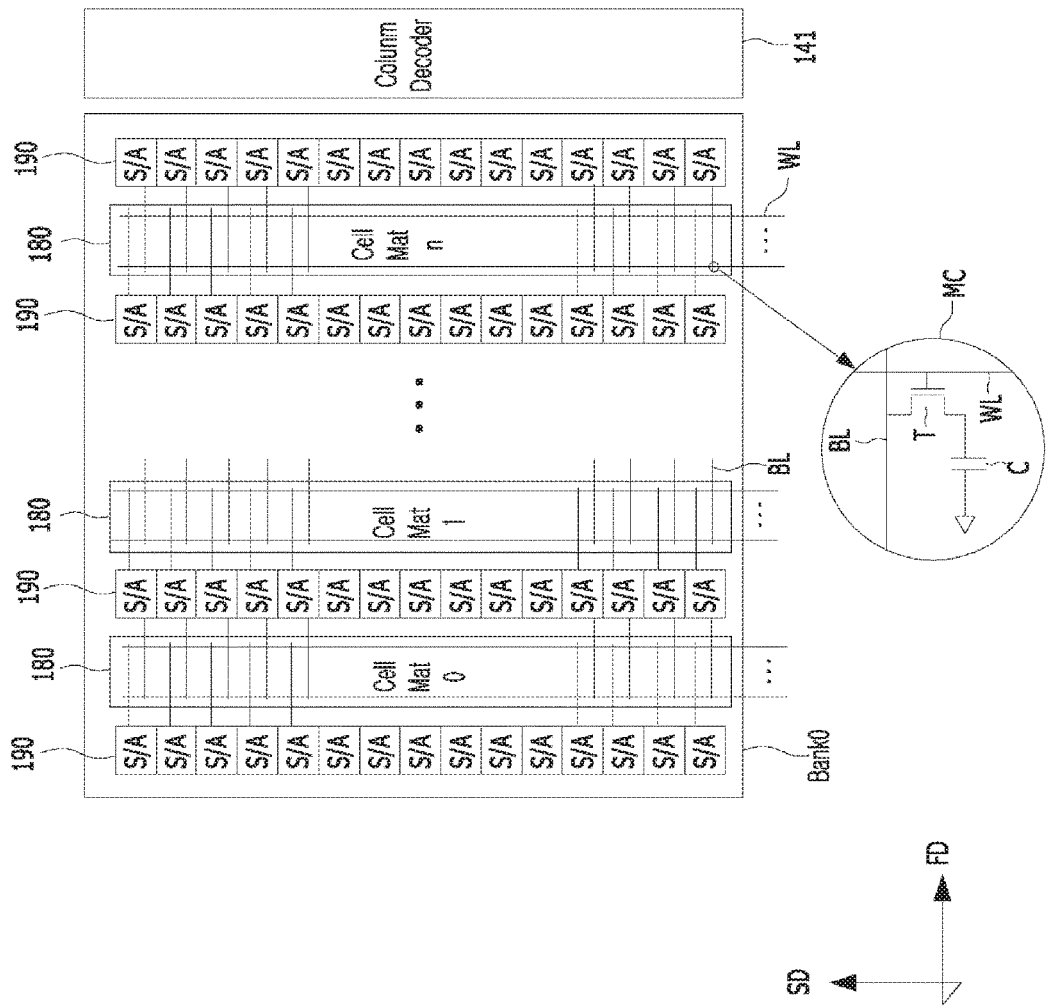
FIG. 4 is a block diagram illustrating a sub bank and a column decoder of FIG. 3.

Referring to FIG. 4, a diagram illustrating a sub bank and a column decoder of FIG. 3 is illustrated. In particular, FIG. 4 illustrates the first sub bank Bank0 and the first column decoder 141 of FIG. 3. The remaining sub banks Bank1 to Bank3 and the remaining column decoders 142 to 144 are realized in a manner similar to the first sub bank Bank0 and the first column decoder 141 shown in FIG. 4.

In FIG. 4, the first sub bank Bank0 may have a structure in which a plurality of cell mats 180 and a plurality of bit line sense amplifier blocks 190 are repeatedly disposed in the first direction FD. Bit line sense amplifier blocks 190 may be respectively disposed on left and right sides of each cell mat 180. In order to maximize the efficiency of the bit line sense amplifier blocks 190 and reduce a chip area, the first sub bank Bank0 may have a shared bit line sense amplifier structure in which one bit line sense amplifier block 190 is used in common for cell mats 180 disposed on the left and right sides thereof.

In each of the cell mats 180, a plurality of bit lines BL which extend in the first direction FD, a plurality of word lines WL which extend in the second direction SD, and a plurality of memory cells MC which are disposed at intersections of the bit lines BL and the word lines WL may be formed. The memory cells MC may be DRAM cells each of which is constructed by one transistor T and one capacitor C, and the first and second semiconductor chips C1 and C2 may be DRAM chips.

The reference symbol S/A designates sense amplifiers which are included in the bit line sense amplifier blocks 190. Further, each of the bit line sense amplifier blocks 190 may include a plurality of sense amplifiers S/A which are arranged in the second direction SD.

The first column decoder 141 may be disposed side by side with the first sub bank Bank0 when viewed in the first direction FD. The first column decoder 141 may generate a decoded column address by decoding a column address signal provided from the controller and generate a column select signal based on the decoded column address.

Figure 5:
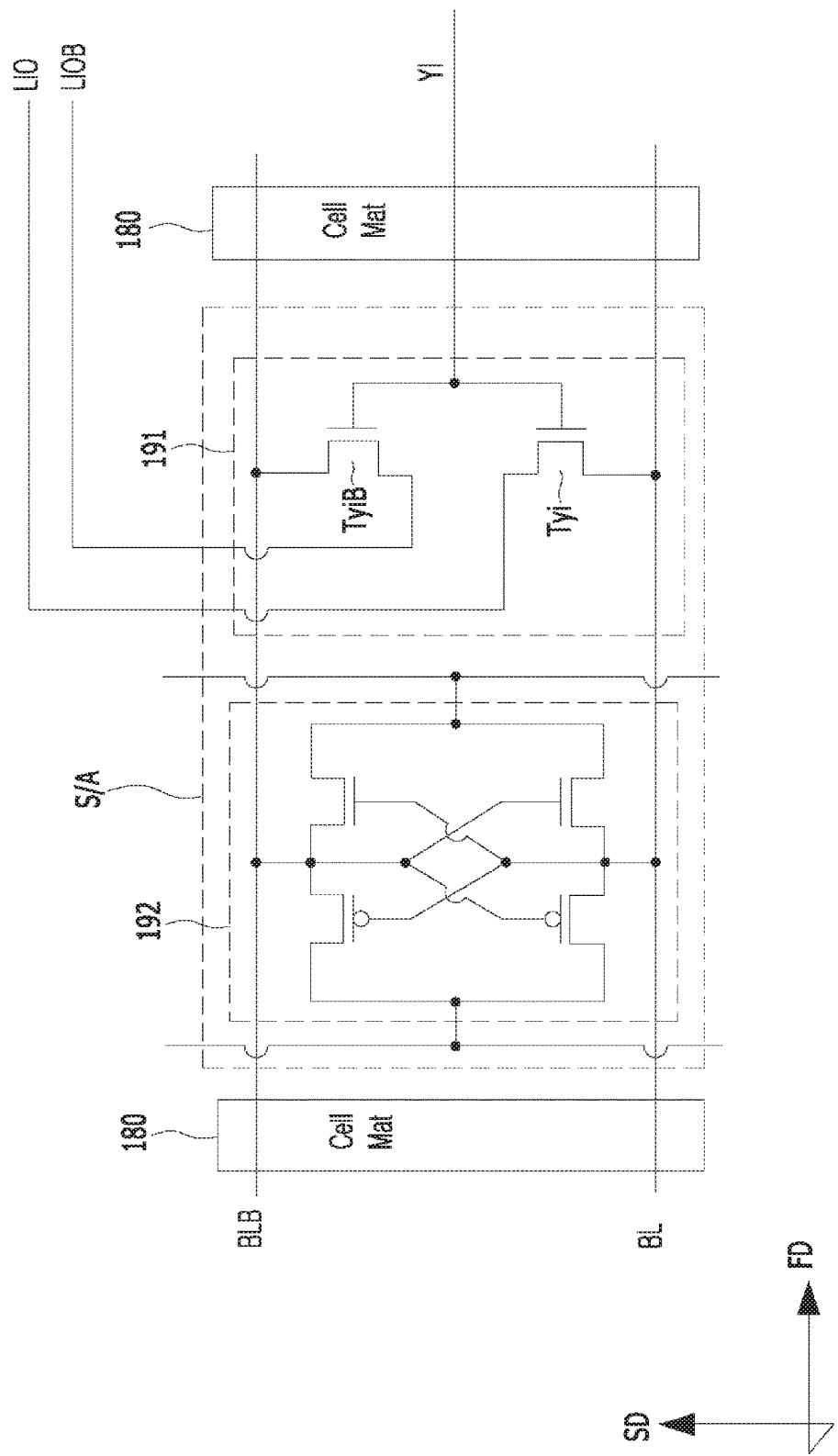
FIG. 5 is a diagram illustrating the circuit configuration of a sense amplifier of FIG. 4.

Referring to FIG. 5, a circuit diagram illustrating a portion of the first sub bank Bank0 of FIG. 4 is described.

The reference symbol YI shown in FIG. 5 designates a column select line for transferring a column select signal generated by the first column decoder 141. The column select line YI may extend in the first direction FD.

In FIG. 5, the sense amplifier S/A may include a column selecting section 191 and a bit line sense amplifier 192. Column select transistors Tyi and TyiB included in the column selecting section 191 may be electrically coupled between local input/output lines LIO and LIOB and bit lines BL and BLB. The column select transistors Tyi and TyiB may select the bit lines BL and BLB in response to the column select signal provided through the column select line YI and electrically couple the selected bit lines BL and BLB with the local input/output lines LIO and LIOB. The local input/output lines LIO and LIOB are to electrically couple the bit lines BL and BLB with global input/output lines, and may extend in the first direction FD.

The bit line sense amplifier 192 may amplify data outputted from a cell mat 180 and transfer amplified data to the local input/output lines LIO and LIOB, or may transfer data inputted through the local input/output lines LIO and LIOB to the cell mat 180.

Although it is illustrated as an example in an embodiment described above with reference FIGS. 3 to 5 that the first and second semiconductor chips C1 and C2 are DRAM chips, it is to be noted that the embodiment is not limited to such an example. The first and second semiconductor chips C1 and C2 may be other kinds of memory chips such as NAND chips and MRAM chips and the configuration of the integrated circuits IC may be changed according to a kind of chips. For example, while not shown, where the first and second semiconductor chips C1 and C2 are NAND chips, each of the integrated chips IC of the first and second semiconductor chips C1 and C2 may include a memory cell array which has a plurality of cell strings constructed by drain select transistors; pluralities of flash memory cells and source select transistors electrically coupled in series between bit lines and source lines; a column decoder which is disposed in a column direction with respect to the memory cell array and generates a column select signal for controlling selection of a bit line of the memory cell array; a page buffer which is disposed between the memory cell array and the column decoder and controls electrical coupling between the bit lines and local input/output lines in response to the column select signal; and a row decoder which generates a word line driving signal for controlling selection of a word line of the memory cell array.

Referring again to FIG. 2, the interconnect structure 130 includes one or more wiring layers which are formed on the active surface 121 of the base substrate 120 and may be formed with pluralities of metal lines M1, M2 and M3 electrically coupled with the integrated circuits IC. In an embodiment, the interconnect structure 130 has a TLM (three layer metal) structure. The interconnect structure 130 includes a first wiring layer in which the first metal lines M1 are positioned. The interconnect structure 130 also includes a second wiring layer which is formed over the first wiring layer and in which the second metal lines M2 are positioned. The interconnect structure 130 also includes a third wiring layer which is formed over the second wiring layer and in which the third metal lines M3 are positioned.

The interconnect structure 130 may further include a plurality of interlayer dielectric layers 161, 162 and 163 which are formed under the wiring layers and insulate the metal lines M1, M2 and M3 formed in the different wiring layers from one another. The interconnect structure 130 may also include conductive vias VIA which pass through the interlayer dielectric layers 161, 162 and 163 and electrically couple the metal lines M1, M2 and M3 formed in the different wiring layers. The metal lines M1, M2 and M3 and the conductive vias VIA may be formed of an alloy including copper, aluminum or another metal, and may be formed by using a damascene process.

The bonding pads 111 and 112 may be formed in the uppermost wiring layer of the interconnect structure 130. For reference, FIG. 2 as a cross-sectional view taken along the line A-A' of FIG. 1 shows only the bonding pads 111 and does not show the bonding pads 112, it is to be understood that not only the bonding pads 111 but also the bonding pads 112 are actually formed in the uppermost wiring layer of the interconnect structure 130.

A protective layer 170 which covers the metal lines M3 formed in the uppermost wiring layer and exposes the bonding pads 111 and 112 may be formed on the uppermost interlayer dielectric layer 163. The top surface of the protective layer 170 as the uppermost layer of the chip unit 100 may be substantially the same surface as the first surface 101 of the chip unit 100.

The interconnect structure 130 of the first and second semiconductor chips C1 and C2 may include signal lines which extend in the first direction FD.

The construction of these signal lines will be described below with reference to FIG. 6.

Figure 6:
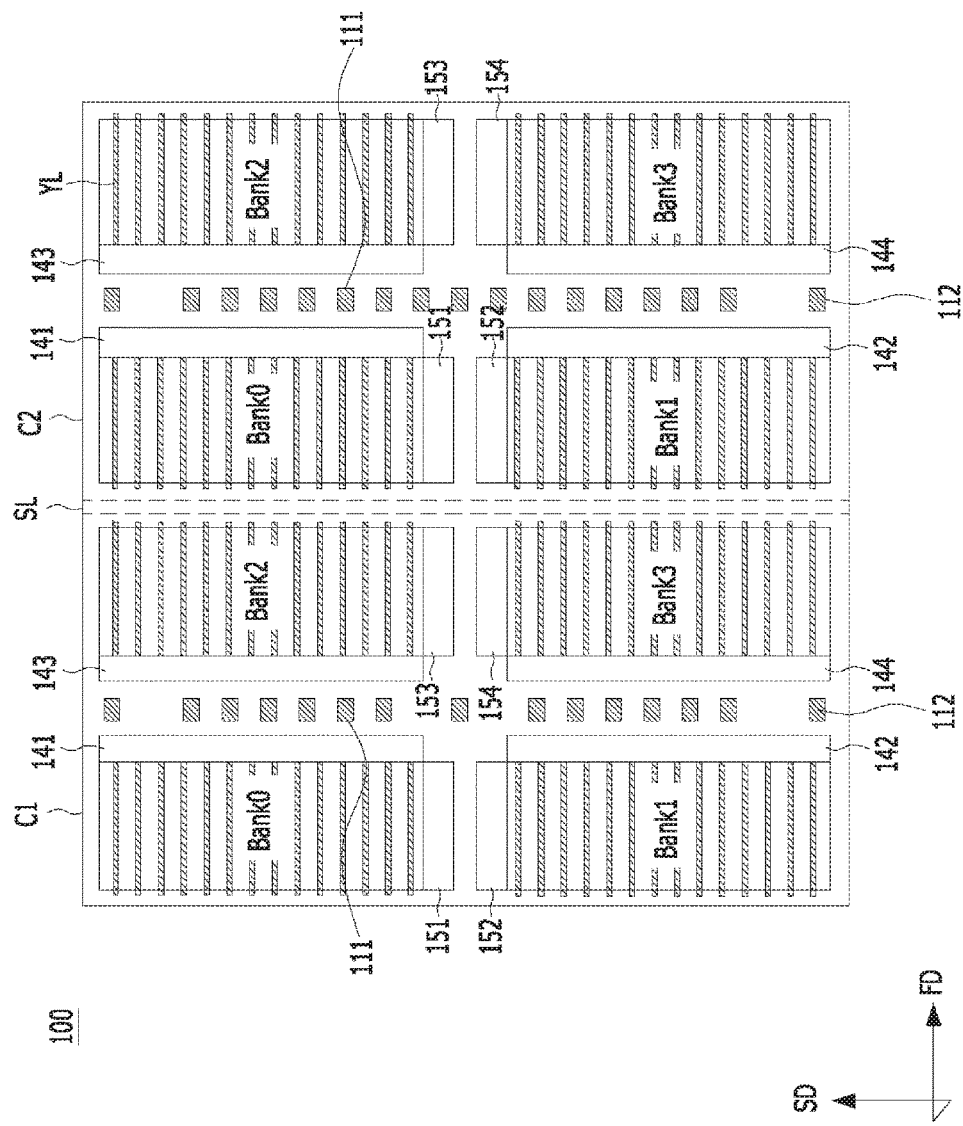
FIG. 6 is a top view illustrating signal lines included in the chip unit of FIG. 1.

Referring to FIG. 6, respective signal lines YL may extend from the center portions of the first and second semiconductor chips C1 and C2 where the bonding pads 111 and 112 are positioned, to the edges of the first and second semiconductor chips C1 and C2 in the first direction FD. The signal lines YL may be arranged in the second direction SD perpendicular to the first direction FD. The signal lines YL may be arranged over the entire surfaces of the first and second semiconductor chips C1 and C2, while having a predetermined width and a predetermined space.

The signal lines YL may be disposed in the uppermost wiring layer of the interconnect structure 130 shown in FIG. 2, that is, in the same layer as the third metal lines M3. However, it is to be noted that the embodiment is not limited to such. The signal lines YL may be disposed in the wiring layer lying under the uppermost wiring layer, or may be disposed in such a way as to be distributed in at least two wiring layers.

The signal lines YL may be column select lines YI (see FIG. 5) for transferring column select signals generated by the column decoders 141 to 144 to the first to fourth sub banks Bank0 to Bank3. In addition, the signal lines YL may be local input/output lines LIO and LIOB (see FIG. 5) which electrically couple bit lines and global input/output lines.

Referring again to FIGS. 1 and 2, the redistribution lines 200 may be disposed on the first surface 101 of the chip unit 100, and may have one ends which are respectively electrically coupled to the bonding pads 111 and 112 and the other ends which face away from the one ends and extend toward the scribe line region SL. The redistribution pads 310 and 320 may be formed on the first surface 101 of the chip unit 100 to be electrically coupled with the other ends of the redistribution lines 200. In an embodiment, the redistribution pads 310 and 320 are arranged in the second direction SD, adjacent to and along the edges of the first and second semiconductor chips C1 and C2 adjoining the scribe line region SL. While it is illustrated in an embodiment that the redistribution pads 310 and 320 are disposed in the first and second semiconductor chips C1 and C2, it is to be noted that the redistribution pads 310 and 320 may be disposed in the scribe line region SL or may be disposed along the boundaries between the first and second semiconductor chips C1 and C2 and the scribe line region SL.

As the number of bonding pads is increased due to improvement in degree of integration and multi-functionality, the number of redistribution pads corresponding thereto is also increased. In particular, in the case of electrically coupling bonding pads and redistribution pads by using redistribution lines formed in a single layer, if the redistribution pads are disposed to be aligned with the bonding pads corresponding to them in the first direction FD, it is possible to dispose a maximum number of redistribution pads within a limited footprint. In this case, the redistribution lines which electrically couple the redistribution pads and the bonding pads are structured to extend in the first direction FD.

However, because pluralities of signal lines which extend in the first direction FD are disposed in the first and second semiconductor chips C1 and C2 over the entire surfaces of the first and second semiconductor chips C1 and C2, the redistribution lines and the signal lines overlap with each other when the redistribution lines are formed in the first direction FD. The redistribution lines and the signal lines overlap with each other, and a dielectric layer are interposed between the redistribution lines and the signal lines. Therefore, capacitors may be formed by the redistribution lines, the signal lines and the dielectric layer interposed therebetween. When voltages are applied to the redistribution lines and the signal lines during the manufacturing of the semiconductor chip module 10, charges are accumulated in the capacitor. The accumulated charges are discharged at a moment that the semiconductor chip module 10 is contact with an external ground. High current generated at the moment can cause a permanent damage to internal circuitry of the semiconductor chip module 10. In other words, if the overlapping area between the redistribution lines and the signal lines is large, CDM property may be degraded. To improve the CDM property, it is necessary to decrease the overlapping area between the redistribution lines and the signal lines.

Figure 7:
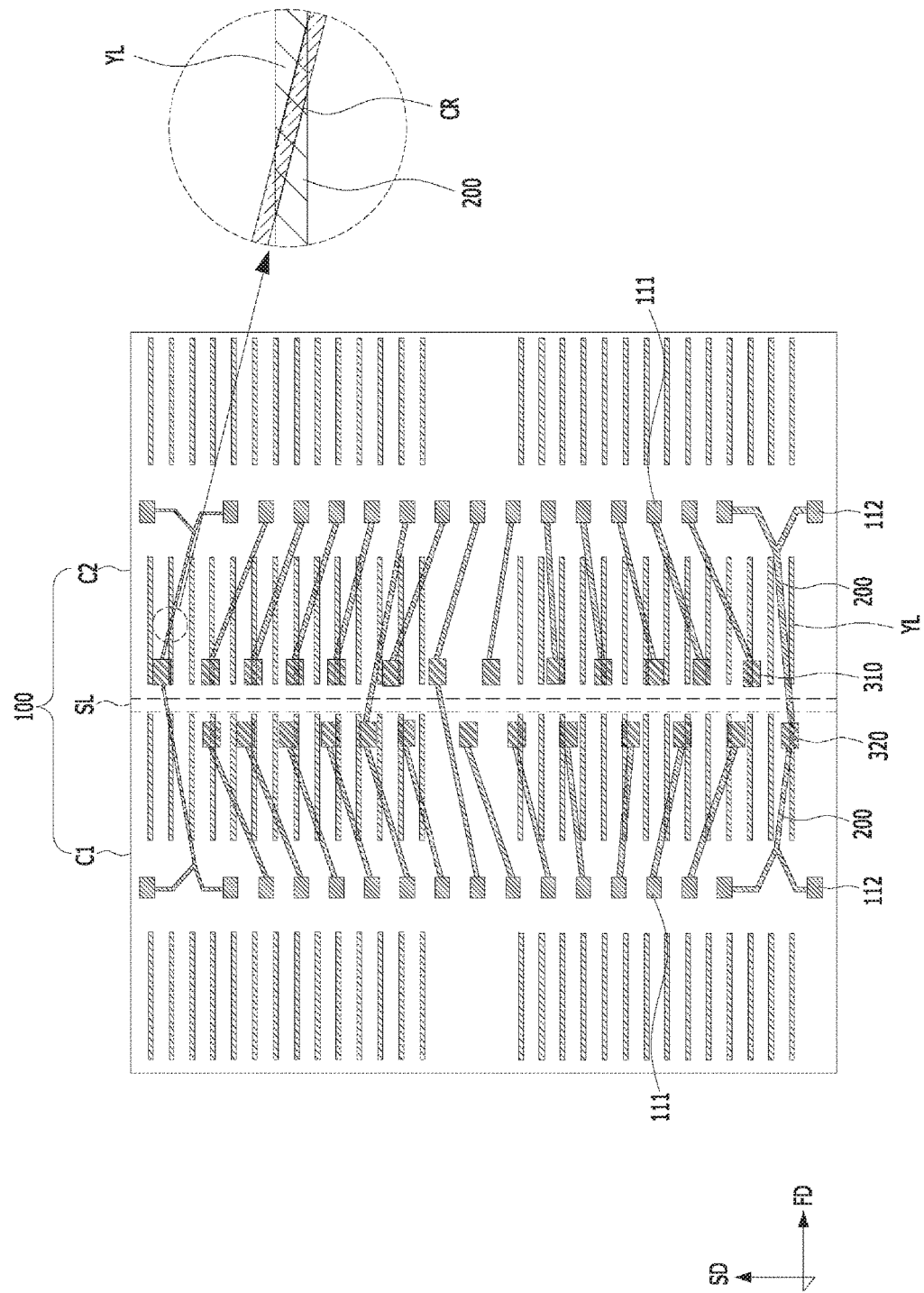
FIG. 7 is a top view illustrating signal lines and redistribution lines in an overlapped manner.

Referring to FIG. 7, the redistribution lines 200 in accordance with an embodiment are formed in a direction oblique to the extending direction of the signal lines YL, that is, the first direction FD. As the redistribution lines 200 are formed in the direction oblique to the first direction FD, at least one of the redistribution lines 200 may cross with at least one of the signal lines YL.

According to an embodiment described above, the redistribution lines 200 and the signal lines YL overlap with each other at only crossing points CR where the redistribution lines 200 and the signal lines YL cross with each other. Accordingly, an amount of charges charged at the overlapping area of the redistribution lines 200 and the signal lines YL may be minimized, and a CDM property may be improved.

If all the redistribution lines 200 are formed in the direction oblique to the first direction FD, intervals between the redistribution pads 310 and 320 are increased when compared to the case where the redistribution lines 200 are arranged side by side in the first direction FD. Therefore, under this condition, a larger space for disposing redistribution pads is needed. Thus, it is necessary to design the semiconductor chip module 10 using redistribution pads the number of which is smaller than the number of the bonding pads 111 and 112 of the first and second semiconductor chips C1 and C2.

Referring again to FIG. 1, the bonding pads 111 and 112 of each of the first and second semiconductor chips C1 and C2 may include a plurality of input pads and a plurality of output pads. The input pads may include a CS pad for the input of a chip select signal (CS); a CKE pad for the input of a clock enable signal (CKE); a ZQ pad for the input of a test signal (ZQ); an ODT pad for the input of a termination control signal (ODT); ADD pads for the input of an address signal (ADD); a CK pad for the input of a clock signal (CK); a BA pad for the input of a bank address signal (BA); a CAS pad for the input of a column address strobe signal (CAS); a RAS pad for the input of a row address strobe signal (RAS); a VDD pad for the input of a power supply voltage (VDD); a VSS pad for the input of a ground voltage (VSS), and so forth.

Among the bonding pads 111 and 112 of each of the first and second semiconductor chips C1 and C2, one or more bonding pads which may be electrically coupled with bonding pads belonging to another semiconductor chip without causing any problem exist. Such bonding pads may include the ADD pads, the CK pad, the BA pad, the CAS pad, the RAS pad, the VDD pad, and the VSS pad. In particular, each of the VDD pad and the VSS pad may be disposed by at least two in each of the first and second semiconductor chips C1 and C2. At least two VDD pads included in the first semiconductor chip C1 and at least two VDD pads included in the second semiconductor chip C2 may be electrically coupled in common without causing any problem. Further, at least two VSS pads included in the first semiconductor chip C1 and at least two VSS pads included in the second semiconductor chip C2 may be electrically coupled in common without causing any problem Among the bonding pads 111 and 112 of each of the first and second semiconductor chips C1 and C2, bonding pads which should not be electrically coupled with, that is, should be electrically isolated from, bonding pads belonging to another semiconductor chip exist. Such bonding pads may include output pads, and at least one of the CS pad, the CKE pad, the ZQ pad and the ODT pad among the input pads. In particular, in a dual die package of LPDDR, DDR3, DDR4 and NAND products, at least one at the minimum among the CS pad, the CKE pad, the ZQ pad and the ODT pad should be isolated unconditionally for each of the first and second semiconductor chips C1 and C2. For example, in the case where CS pads and CKE pads are electrically coupled, ZQ pads and ODT pads should be isolated for each of the first and second semiconductor chips C1 and C2, to ensure individual operations of the first and second semiconductor chips C1 and C2.

In the following descriptions, for the sake of convenience in explanation, bonding pads which should be electrically isolated for each of the first and second semiconductor chips C1 and C2 will be defined as first bonding pads 111. In addition, bonding pads which belong to the respective first and second semiconductor chips C1 and C2 and may be electrically coupled without causing any problem will be defined as second bonding pads 112.

The redistribution pads 310 and 320 may include individual redistribution pads 310 which respectively correspond to the first bonding pads 111 of the first and second semiconductor chips C1 and C2. The redistribution pads 310 and 320 may also include one or more shared redistribution pads 320 which correspond in common to one or more second bonding pads 112 of the first semiconductor chip C1 and one or more second bonding pads 112 of the second semiconductor chip C2.

The individual redistribution pads 310 are respectively individually electrically coupled to the first bonding pads 111 of the first and second semiconductor chips C1 and C2 through the redistribution lines 200. The respective shared redistribution pads 320 are electrically coupled in common to the one or more second bonding pads 112 of the first semiconductor chip C1 and the one or more second bonding pads 112 of the second semiconductor chip C2. One or more shared redistribution pads 320 are shared by the first semiconductor chip C1 and the second semiconductor chip C2. Accordingly, it is possible to design the semiconductor chip module 10 using redistribution pads the number of which is smaller than the number of the bonding pads 111 and 112 of the first and second semiconductor chips C1 and C2.

Referring again to FIG. 2, a dielectric layer pattern 400 which covers the redistribution lines 200 and exposes the redistribution pads 310 and 320 may be additionally formed on the first surface 101 of the chip unit 100.

Figure 8:
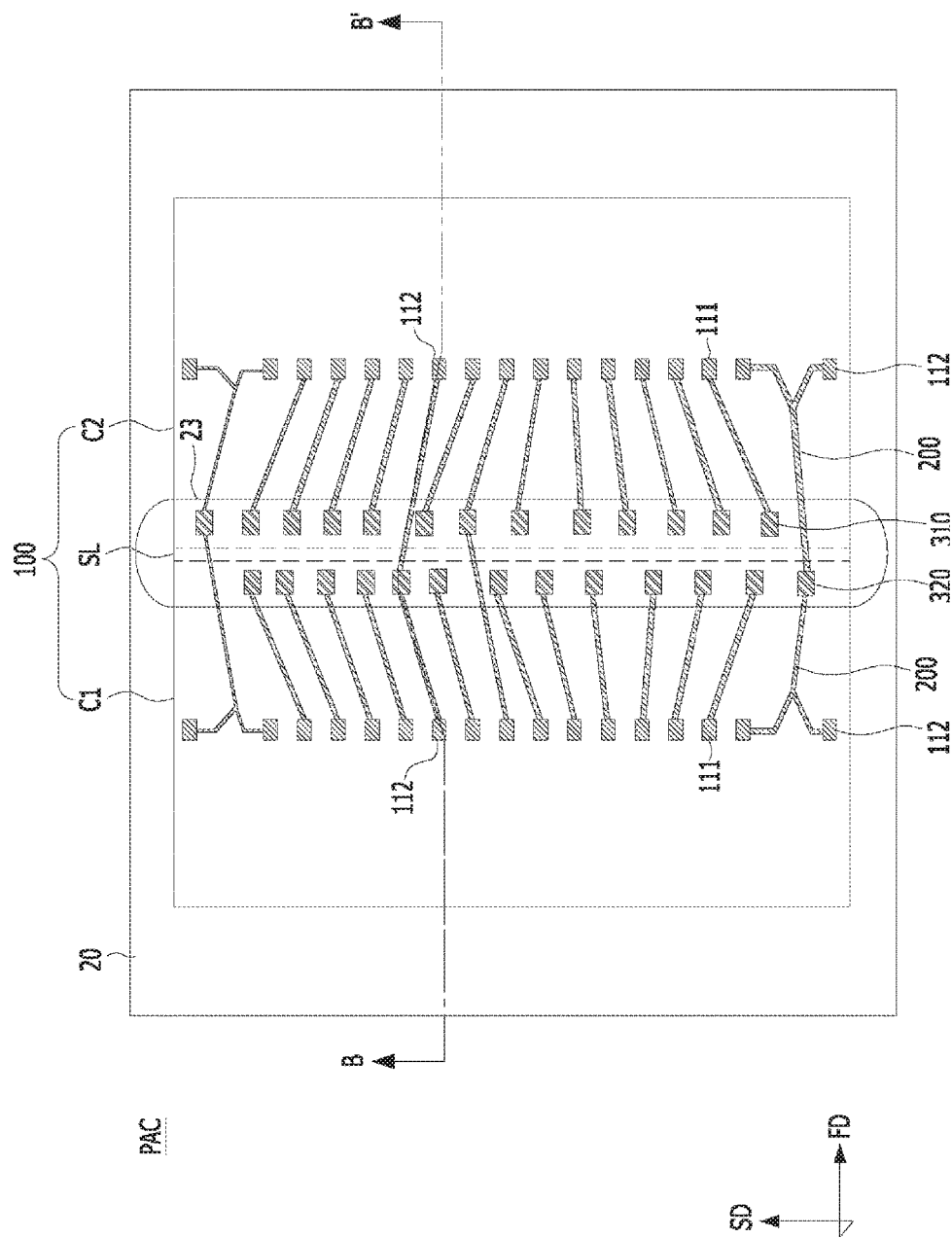
FIG. 8 is a top view illustrating a representation of an example of a semiconductor package in accordance with an embodiment.

Referring to FIG. 8, a top view illustrating a representation of an example of a semiconductor package using the above-described semiconductor chip module 10 in accordance with an embodiment is described. Further, also described is FIG. 9, a cross-sectional view of the semiconductor package shown in FIG. 8. Moreover, FIG. 9 is a cross-sectional view taken along the line B-B' of FIG. 8.

Figure 9:
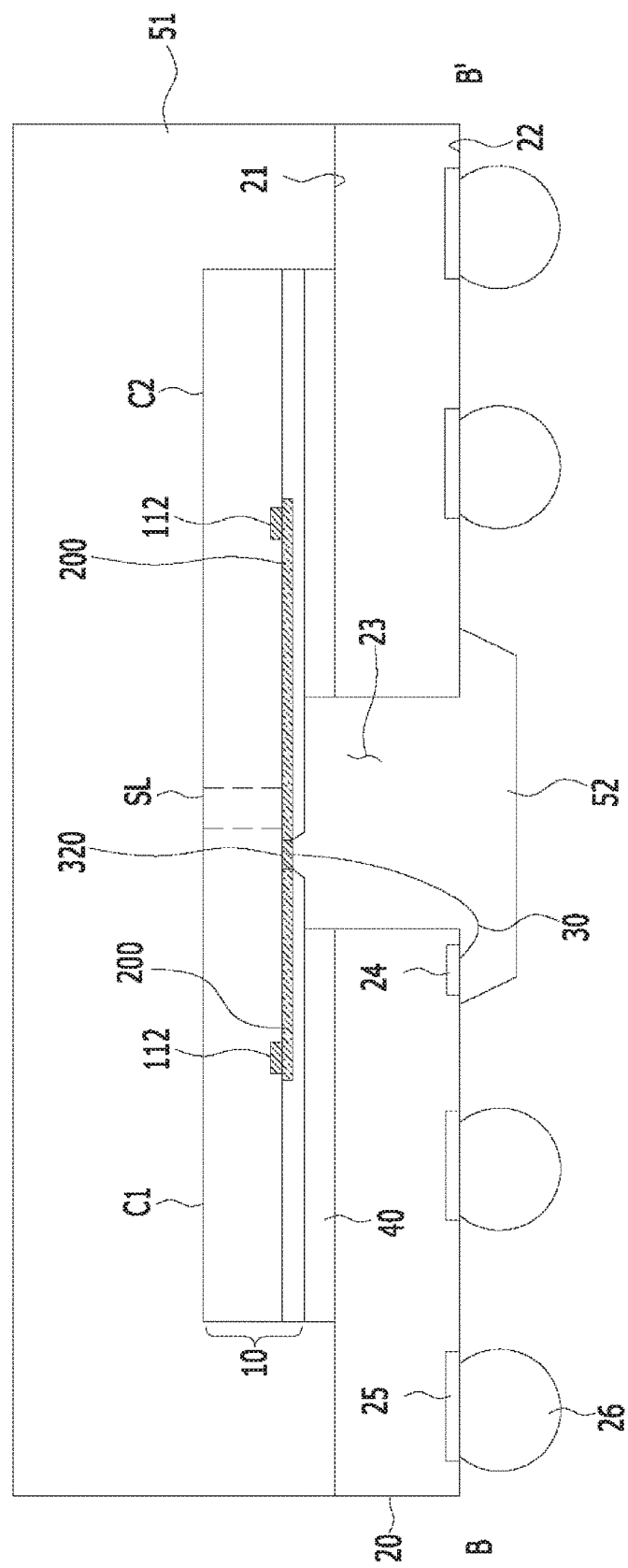
FIG. 9 is a cross-sectional view taken along the line B-B' of FIG. 8.

IN FIGS. 8 and 9, a semiconductor package PAC in accordance with an embodiment may include a semiconductor chip module 10, a substrate 20, and conductive coupling members 30. Besides, the semiconductor package PAC in accordance with the embodiment may further include an adhesive member 40 and molding parts 51 and 52.

The substrate 20 may be a printed circuit board. The substrate 20 may have a top surface 21, a bottom surface 22, and an opening 23 which passes through the top surface 21 and the bottom surface 22. The substrate 20 may include a plurality of coupling pads 24 which are disposed adjacent to and along the edges of the opening 23 on the bottom surface 22, and a plurality of external electrodes 25 which are formed on the bottom surface 22. External connection terminals 26 such as solder balls, conductive bumps and conductive posts may be attached to the external electrodes 25, respectively. The embodiment illustrated in FIG. 9 shows the case where solder balls are used as the external connection terminals 26. The semiconductor package PAC may be mounted to an external device, for example, a main board, by the medium of the external connection terminals 26.

The semiconductor chip module 10 may be disposed on the top surface 21 of the substrate 20 such that one surface of the semiconductor chip module 10 on which individual redistribution pads 310 and shared redistribution pads 320 are disposed faces the substrate 20 and the individual redistribution pads 310 and the shared redistribution pads 320 are exposed through the opening 23 of the substrate 20. The adhesive member 40 may be formed between the semiconductor chip module 10 and the substrate 20 to attach the semiconductor chip module 10 and the substrate 20 to each other.

The conductive coupling members 30 electrically couple the redistribution pads 310 and 320 of the semiconductor chip module 10 and the coupling pads 24 formed on the bottom surface 22 of the substrate 20 through the opening 23. The conductive coupling members 30 may include conductive wires.

The molding parts 51 and 52 are to protect the semiconductor chip module 10 and the conductive coupling members from external devices and external circumstances. The molding parts 51 and 52 may be formed on the top surface 21 and in the opening 23 of the substrate 20 to cover the semiconductor chip module 10 and the conductive coupling members 30. The molding parts 51 and 52 may be constructed by one or at least two of polymer composite materials such as an epoxy resin having a filler, an epoxy acrylate having a filler and a polymer having a filler.

The above-described semiconductor package may be applied to various semiconductor devices and package modules.

Figure 10:
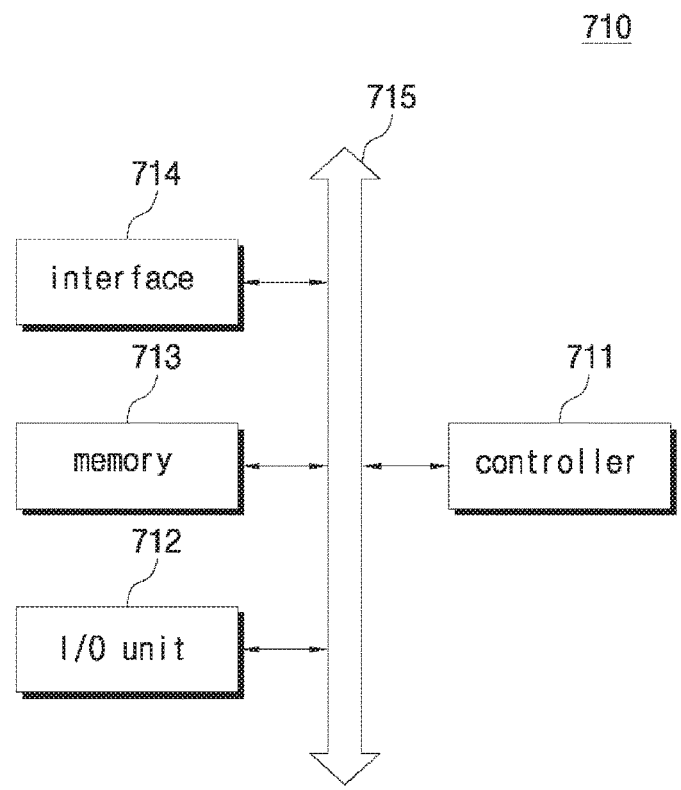
FIG. 10 is a block diagram illustrating a representation of an example of an electronic system which includes the semiconductor package in accordance with an embodiment.

Referring to FIG. 10, the semiconductor package in accordance with an embodiment which may be applied to an electronic system 710 is described. The electronic system 710 may include a controller 711, an input/output unit 712, and a memory 713. The controller 711, the input/output unit 712 and the memory 713 may be electrically coupled with one another through a bus 715 which provides a data movement path.

For example, the controller 711 may include at least one microprocessor, at least one digital signal processor, at least one microcontroller, and at least one of logic circuits capable of performing the same functions as these components. The memory 713 may include the semiconductor package in accordance with an embodiment. The input/output unit 712 may include at least one selected among a keypad, a keyboard, a display device, a touch screen, and so forth. The memory 713 as a device for storing data may store data or/and commands to be executed by the controller 711 or the like.

The memory 713 may include a volatile memory device such as a DRAM or/and a nonvolatile memory device such as a flash memory. For example, a flash memory may be mounted to an information processing system such as a mobile terminal or a desk top computer. The flash memory may be configured as a solid state drive (SSD). In this case, the electronic system 710 may stably store a large amount of data in a flash memory system.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

Where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 11:
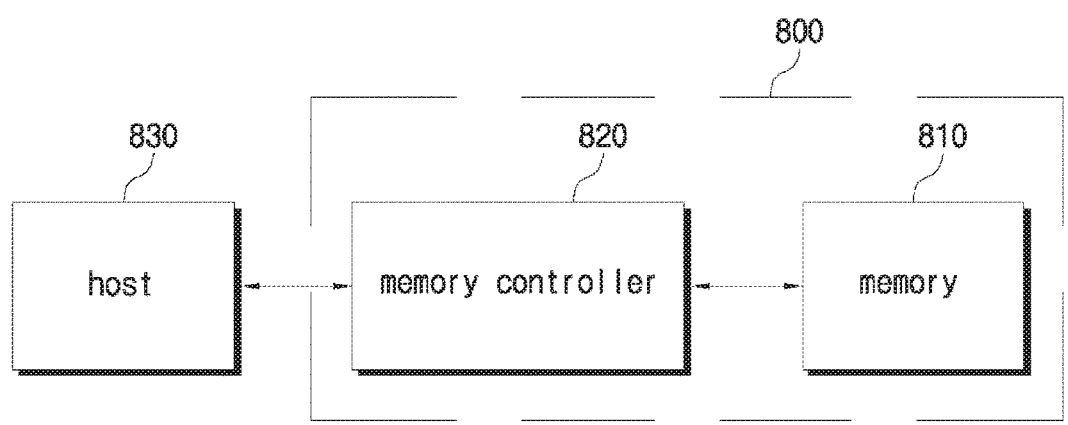
FIG. 11 is a block diagram illustrating a representation of an example of a memory card which includes the semiconductor package in accordance with an embodiment.

Referring to FIG. 11, the semiconductor package in accordance with an embodiment may be provided in the form of a memory card 800. For example, the memory card 800 may include a memory 810 such a nonvolatile memory device and a memory controller 820. The memory 810 and the memory controller 820 may store data or read stored data.

The memory 810 may include at least any one among nonvolatile memory devices to which the semiconductor package in accordance with an embodiment is applied. In addition, the memory controller 820 may control the memory 810 to read stored data or store data, in response to a read/write request from a host 830.

While various embodiments have been described above, it will be understood to those skilled in the art that the embodiments described are by way of examples only. Accordingly, the semiconductor chip module and the semiconductor package including the same described herein should not be limited based on the described embodiments.

What is claimed is:
1. A semiconductor package comprising:
a substrate including a top surface, a bottom surface, an opening which passes through the top surface and the bottom surface, and coupling pads formed over the bottom surface;
a semiconductor chip module including a chip unit including first and second semiconductor chips formed over a single body to be adjacent in a first direction with a scribe line region interposed therebetween, and having a first surface over which bonding pads of the first and second semiconductor chips are positioned and a second surface which faces away from the first surface, a plurality of oblique redistribution lines formed over the first surface, having one set of ends which are respectively electrically coupled to the bonding pads of the first and second semiconductor chips, and extending toward the scribe line region, and a plurality of redistribution pads disposed over the first surface, and electrically coupled with another set of ends of the oblique redistribution lines which face away from the one set of ends, the semiconductor chip module being disposed over the substrate such that the redistribution pads are exposed through the opening; and
conductive coupling members electrically coupling the redistribution pads and the coupling pads through the opening,
the redistribution pads comprising:
one or more shared redistribution pads electrically coupled in common to one or more of the oblique redistribution lines electrically coupled to the bonding pads of the first semiconductor chip and one or more of the oblique redistribution lines electrically coupled to the bonding pads of the second semiconductor chip; and
a plurality of individual redistribution pads individually electrically coupled to the oblique redistribution lines which are not electrically coupled with the shared redistribution pads,
wherein the bonding pads are arranged along a second direction perpendicular to the first direction,
wherein the first and second semiconductor chips are electrically connected each other through the shared redistribution pads and the oblique redistribution lines electrically coupled to the shared redistribution pads,
the oblique redistribution lines are inclined with respective to the first direction.
2. The semiconductor package according to claim 1, wherein each of the first and second semiconductor chips comprises a plurality of signal lines which extend in the first direction.
3. The semiconductor package according to claim 2, wherein the signal lines have a predetermined width and a predetermined space, and are arranged in the second direction.

4. The semiconductor package according to claim 2, wherein the chip unit comprises:
a base substrate;
integrated circuits respectively defined in the first and second semiconductor chips of the base substrate; and
an interconnect structure formed over the base substrate and the integrated circuits, and having at least one wiring layer in which the signal lines are disposed.

5. The semiconductor package according to claim 4, wherein the interconnect structure includes at least two wiring layers, and the signal lines are disposed in an uppermost wiring layer of the at least two wiring layers.

6. The semiconductor package according to claim 4, wherein the interconnect structure includes at least two wiring layers, and the signal lines are disposed by being distributed in the at least two wiring layers.

7. The semiconductor package according to claim 4, wherein each of the integrated circuits comprises:
a memory cell array including bit lines which extend in the first direction, word lines which extend in the second direction, and a plurality of memory cells which are disposed at intersections of the bit lines and the word lines; and
a column decoder configured to generate a column select signal for controlling selection of the bit lines.

8. The semiconductor package according to claim 7, wherein the memory cell array and the column decoder are arranged in the first direction.

9. The semiconductor package according to claim 7, wherein the memory cell array further includes column select transistors electrically coupled between the bit lines and local input/output lines, selects the bit lines in response to the column select signal, and electrically couples the selected bit lines and the local input/output lines.

10. The semiconductor package according to claim 9, wherein the signal lines comprise column select lines for transferring the column select signal generated by the column decoder to the column select transistors.

11. The semiconductor package according to claim 9, wherein the signal lines comprise the local input/output lines.

12. The semiconductor package according to claim 1, wherein the bonding pads of the first and second semiconductor chips comprise:
first bonding pads electrically coupled with the individual redistribution pads through the redistribution lines; and
second bonding pads electrically coupled with the shared redistribution pads through the redistribution lines.

13. The semiconductor package according to claim 12, wherein the first bonding pads comprise one or more output pads for output of signals to an exterior and input pads for input of a chip select signal, a clock enable signal, a test signal and an on-die termination signal.

14. The semiconductor package according to claim 12, wherein the second bonding pads comprise one or more input pads for input of a bank address signal, a clock signal, an address command signal, a column address strobe signal, a row address strobe signal, a ground voltage and a power supply voltage.

15. The semiconductor package according to claim 1, wherein the redistribution pads are disposed adjacent to and along edges of the first and second semiconductor chips adjoining the scribe line region in the second direction.

16. The semiconductor package according to claim 1, wherein the oblique redistribution lines are disposed in a single layer.

17. The semiconductor package according to claim 2, wherein at least one of the signal lines and at least one of the oblique redistribution lines cross with each other, and the signal lines and the oblique redistribution lines overlap with each other only at crossing points where they cross with each other.

18. The semiconductor package according to claim 1, wherein the conductive coupling members comprise conductive wires.

19. The semiconductor package according to claim 1, further comprising:
an adhesive member formed between the semiconductor chip module and the substrate, and attaching the semiconductor chip module and the substrate to each other.

20. The semiconductor chip module according to claim 17, wherein the crossing points indicate where the oblique redistribution lines and the plurality of signal lines cross with each other.

21. The semiconductor chip module according to claim 1, wherein the number of bonding pads is greater than the number of redistribution pads.

* * * * *